(12) United States Patent
Ha et al.

(10) Patent No.: US 9,923,407 B2
(45) Date of Patent: Mar. 20, 2018

(54) APPARATUS AND METHOD FOR CONTROLLING DIFFERENTIAL SIGNALS OF WIRELESS POWER TRANSMITTER

(71) Applicant: Samsung Electronics Co., Ltd., Gyeonggi-do (KR)

(72) Inventors: Mincheol Ha, Gyeonggi-do (KR); Kang-Ho Byun, Gyeonggi-do (KR); Kihyun Kim, Gyeonggi-do (KR); Jihye Kim, Gyeonggi-do (KR); Seho Park, Gyeonggi-do (KR); Kumjong Sun, Gyeonggi-do (KR); Wooram Lee, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 226 days.

(21) Appl. No.: 15/008,932

(22) Filed: Jan. 28, 2016

(65) Prior Publication Data

US 2016/0226294 A1    Aug. 4, 2016

(30) Foreign Application Priority Data

Jan. 29, 2015   (KR) ........................ 10-2015-0014205

(51) Int. Cl.
*H02J 7/02*   (2016.01)
*H02J 50/12*  (2016.01)
*H03K 5/151*  (2006.01)
*H04B 5/00*   (2006.01)
*H02J 7/04*   (2006.01)

(52) U.S. Cl.
CPC .............. *H02J 7/025* (2013.01); *H02J 50/12* (2016.02); *H03K 5/151* (2013.01); *H04B 5/0031* (2013.01); *H04B 5/0037* (2013.01); *H04B 5/0075* (2013.01); *H02J 7/04* (2013.01)

(58) Field of Classification Search
CPC .. H04B 5/0037; H04B 5/0075; H04B 5/0031; H02J 7/04; H03K 5/157
See application file for complete search history.

(56) References Cited

FOREIGN PATENT DOCUMENTS

KR    10-2013-0142861 A    12/2013
WO    2013/191443 A1       12/2013

*Primary Examiner* — Robert Deberadinis
(74) *Attorney, Agent, or Firm* — Cha & Reiter, LLC (57) ABSTRACT

Various embodiments of the present disclosure relate to an apparatus and method for controlling a differential signal of a wireless power transmitter. For example, an apparatus for controlling a differential signal of a wireless power transmitter may include a converter configured to convert a single signal into differential signals; an amplifier operably coupled to the converter and configured amplify power of the differential signals, thereby providing amplified differential signals; a gauge operably coupled to the amplifier and configured to measure a phase difference and amplitude between the amplified differential signals; and a controller for converting a pulse width of the differential signals by controlling the converter according to measurements by the gauge. Further, various embodiments of the present disclosure also include other embodiments other than the aforementioned embodiments.

20 Claims, 6 Drawing Sheets

I2C Code: 0

I2C Code: 20

I2C Code: 40

I2C Code: 60

I2C Code: 80

I2C Code: 35

FIG.5

I2C Code: 0

I2C Code: 20

I2C Code: 40

I2C Code: 60

I2C Code: 80

I2C Code: 35

FIG.6

APPARATUS AND METHOD FOR CONTROLLING DIFFERENTIAL SIGNALS OF WIRELESS POWER TRANSMITTER

CLAIM OF PRIORITY

This application claims the benefit under 35 U.S.C. § 119(a) of a Korean patent application filed in the Korean Intellectual Property Office on Jan. 29, 2015 and assigned Serial No. 10-2015-0014205, the entire disclosure of which is hereby incorporated by reference.

BACKGROUND

Various embodiments of the present disclosure relate to an apparatus and method for controlling differential signals of a wireless power transmitter.

A wireless power transmission technique may include a magnetic induction scheme for wirelessly transmitting power by using a magnetic field induced from a coil, a magnetic resonance scheme for wirelessly transmitting power by using a resonance phenomenon between coils, and an antenna scheme for wirelessly transmitting power by using an antenna beam.

A resonance-type wireless power transmission system to which the magnetic resonance scheme is applied may include a resonance-type wireless power Transmitter (Tx) and a resonance-type wireless power Receiver (Rx). The resonance-type wireless power Tx may generate a magnetic field which vibrates at a specific resonance frequency in a transmission coil. The resonance-type wireless power Rx may charge a battery by intensively receiving the magnetic field which vibrates at the specific frequency through a reception coil, and may use the battery as operating power.

SUMMARY

Various embodiments of the present disclosure provide an apparatus and method for controlling a differential signal of a wireless power transmitter capable of improving transmission efficiency of wireless power by measuring and controlling a phase difference and amplitude between differential signals in an adaptive manner in a resonance-type wireless power Transmitter (Tx).

According to various embodiments of the present disclosure, transmission efficiency deterioration which may occur due to a deviation and parasitic component of electronic components included in a wireless power Tx, and a limited switching speed or the like can be effectively improved.

Further, transmission efficiency deterioration which occurs due to a phase difference or the like between a Tx resonator in the resonance-type wireless power Tx and an Rx resonator in a resonance-type wireless power Receiver (Rx) and a harmonic radiation feature can be improved.

According to various embodiments of the present disclosure, an apparatus for controlling a differential signal of a wireless power transmitter is provided. The apparatus may include a converter configured to convert a single signal into differential signals; an amplifier operably coupled to the converter and configured amplify power of the differential signals, thereby providing amplified differential signals; a gauge operably coupled to the amplifier and configured to measure a phase difference and amplitude between the amplified differential signals; and a controller for converting a pulse width of the differential signals by controlling the converter according to measurements by the gauge.

According to various embodiments of the present disclosure, a method of controlling a differential signal of a wireless power transmitter is provided. The method may include converting a single signal into differential signals; amplifying power of the differential signals, thereby resulting in amplified differential signals; measuring a phase difference and amplitude between the amplified differential signals; and controlling a pulse width of the differential signals according to the measuring.

According to various embodiments, a computer readable recording medium is provided for storing a program for performing a method comprising: converting a single signal into differential signals; amplifying power of the differential signals, thereby resulting in amplified differential signals; measuring a phase difference and amplitude between the amplified differential signals; and converting a pulse width of the differential signals according to the measuring.

DETAILED DESCRIPTION

Hereinafter, various embodiments of the present disclosure will be described with reference to the accompanying drawings. In the following description, specific details such as detailed configuration and components are merely provided to assist the overall understanding of these embodiments of the present disclosure. Therefore, it should be apparent to those skilled in the art that various changes and modifications of the embodiments described herein can be made without departing from the scope and spirit of the present disclosure. In addition, descriptions of well-known functions and constructions are omitted for clarity and conciseness.

According to various embodiments of the present disclosure, an apparatus and method for controlling a differential signal of a wireless power Transmitter (Tx) 100 may be applied to the resonance-type wireless power Tx 100 including, for example, a resonance-type wireless power transmission system.

A power amplifier is used to improve the capability of the resonance-type wireless power Tx 100. A power amplifier of a switching mode can improves power amplification efficiency by decreasing an amount of wasted current and voltage applied to a drain or collector of a transistor.

The power amplifier of the switching mode may include for example, a class-D power amplifier, a class-E power amplifier, or the like. The power amplifier of the switching mode may have a low even-order harmonic feature depending on a balance structure when the power amplifier is designed with a differential mode.

The power amplifier of the switching mode may have an efficiency of 100% in theory, but has a disadvantage in that the efficiency is partially decreased due to a parasitic component existing in real constitutional elements and a limited switching speed or the like. This disadvantage becomes worse when an operating frequency of the power amplifier is high.

When a resonance-type wireless power transmission system is implemented by using the power amplifier of the switching mode, a load impedance of the power amplifier of the switching mode varies depending on a positional difference between a Tx resonator in a resonance-type wireless power Tx and an Rx resonator in a resonance-type wireless power Receiver (Rx).

In the resonance-type wireless power Tx 100 according to various embodiments of the present disclosure, a switching-mode power amplifier which is one of high-efficient power amplifiers may be used. For example, between a class-D power amplifier and a class-E power amplifier, the class-D power amplifier may be used. Further, the class-E power amplifier may be implemented in a differential manner and may be applied to the various embodiments of the present disclosure.

The class-D power amplifier is appropriate to an application field of wireless power transmission even though values of required components vary depending on a load impedance, and in particular, when the resonance-type wireless power Tx 100 is designed on the basis of a differential signal, may have a low even-order harmonic feature depending on a balance structure.

In the resonance-type wireless power transmission system, since a load impedance of the power amplifier included in the resonance-type wireless power Tx 100 varies depending on a relative position between a Tx resonator of the resonance-type wireless power Tx 100 and an Rx resonator of a resonant-type wireless power Rx 200, a phase difference and an amplitude may be mismatched between differential signals. As a result, efficiency of power transmission may deteriorate, and result in harmonic radiation.

By considering this, in various embodiments of the present disclosure, the phase difference and amplitude between the differential signals are measured and controlled in an adaptive manner in the resonance-type wireless power Tx 100, thereby ensuring a high efficiency feature and output of power transmission and a harmonic feature.

Figure 1:
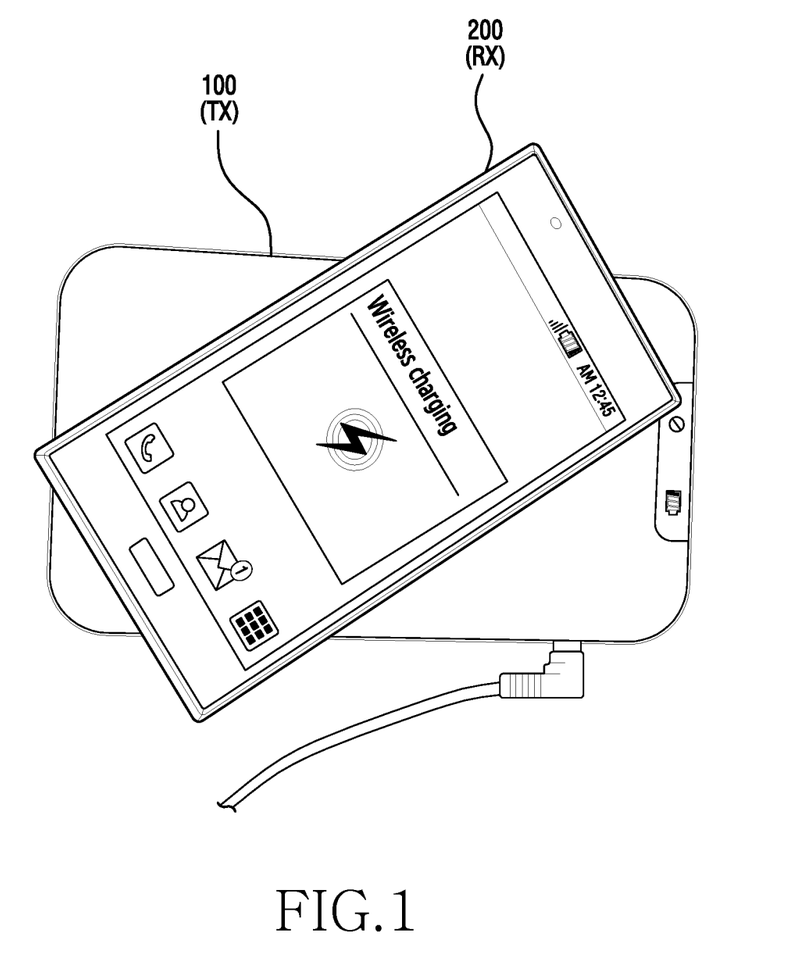
FIG. 1 illustrates an example of a resonance-type wireless power transmission system according to various embodiments of the present disclosure.

FIG. 1 illustrates an example of a resonance-type wireless power transmission system according to various embodiments of the present disclosure. Referring to FIG. 1, the resonance-type wireless power transmission system may include a resonance-type wireless power Tx 100 and a resonance-type wireless power Rx 200.

The resonance-type wireless power Rx 200 may be one of various types of electronic devices such as a smart phone. The resonance-type wireless power Tx 100 may be manufactured in various forms such as a charging pad or the like for performing a wireless power transmission operation when the resonance-type wireless power Rx 200 approaches within a pre-set specific distance or is cradled.

The resonance-type wireless power Tx 100 may convert Direct Current (DC) based power into Alternating Current (AC) based power, and thereafter may transmit power by generating a magnetic field which vibrates at a specific frequency. The resonance-type wireless power Rx 200 may intensively receive the magnetic field, may convert it into DC based power having a specific magnitude, and thereafter may charge the battery or may use it for operating power.

Figure 2:
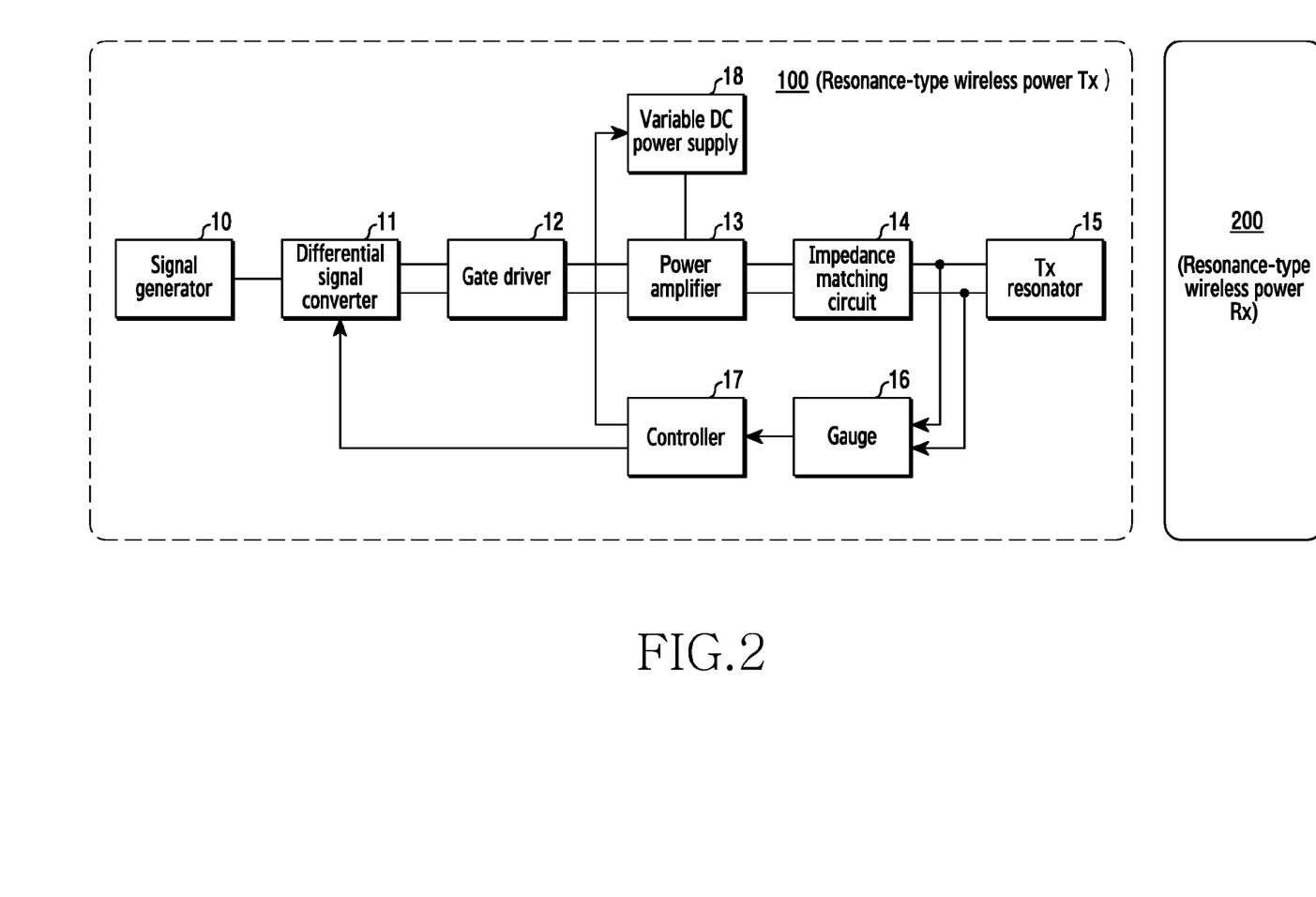
FIG. 2 illustrates an example of a structure of a resonance-type wireless power Transmitter (Tx) according to various embodiments of the present disclosure.

FIG. 2 illustrates an example of a structure of a resonance-type wireless power Tx 100 according to various embodiments of the present disclosure. Referring to FIG. 2, the resonance-type wireless power Tx 100 may include, for example, a signal generator 10, that may be a crystal oscillator or a Voltage Controlled Oscillator (VCO), for example, operably coupled to a differential signal converter 11 and configured to convert a single signal output from the signal generator 10 into two differential signals, a gate driver 12 operably coupled to the differential signal converter 11 and configured to amplify the differential signals to have a specific signal level, and a power amplifier 13 operably coupled to the gate driver 12 and configured to amplify a frequency signal pre-amplified through the gate driver 12 into a high-energy signal.

Further, the resonance-type wireless power Tx 100 may include a variable DC power supply 18 operably coupled to and configured to variably provide DC power to the power amplifier 13, an impedance matching circuit 14 operably coupled to the power amplifier 13 and configured to receive the output of the power amplifier 13 and perform impedance matching, and a Tx resonator 15 operably coupled to the impedance matching circuit 14 and configured to generating a magnetic field which vibrates according to high-energy differential signals generated in the power amplifier 13 and for transmitting DC power supplied from the variable DC power supply 18.

Further, the resonance-type wireless power Tx 100 may include a feedback loop comprising a gauge 16 operably coupled to the impedance matching circuit 14 and the Tx resonator 15 and configured to measure a phase difference and amplitude between the differential signals input to the Tx resonator 15, and a controller 17 operably coupled to the differential signal converter 11 and variable DC power supply 18 and configured to control the differential signal converter 11 and the variable DC power supply 18 in an adaptive manner on the basis of the phase difference and amplitude between the differential signals measured by the gauge 16.

For example, the controller 17 may precisely control the differential signal converter 11 by using a digital code value so that the phase difference between the differential signals measured by the gauge 16 is to be a pre-set reference value (e.g., a phase difference within a threshold of 180°) and so that the difference in amplitude between the different signals is to be a pre-set reference value (e.g., within another threshold to zero, i.e., the differential signals have the same amplitude).

Further, the controller 17 may precisely control the variable DC power supply 18 by using a digital code value so that the amplitude of the differential signals is to be a pre-set reference Peak to Peak (P2P) value, and may collectively control a wireless power transmission operation. Herein, the controller 17 may be constructed of a Micro Controller Unit (MCU), a central processing unit (CPU), or an Application Specific Integrated Circuit (ASIC), for example.

Meanwhile, if the differential signal converter 11 is designed to operate digitally, such as using Pulse Width Modulation (PWM), for example, a phase can be controlled through a digital control. However, a phase control of the differential signal depends on a clock frequency of a component for controlling a PWM signal.

For example, when the resonance-type wireless power transmission system is implemented by using a frequency of 6.78 MHz, since a high control resolution is required, the component for controlling the differential signal converter 11 may use a high operation clock.

When the differential signal converter 11 is designed in an analog manner in which a fully differential Operational-Amplifier (OP-AMP) may be used, it is dependent on a frequency bandwidth of the OP-AMP. However, an additional circuit is used for phase control.

Figure 3:
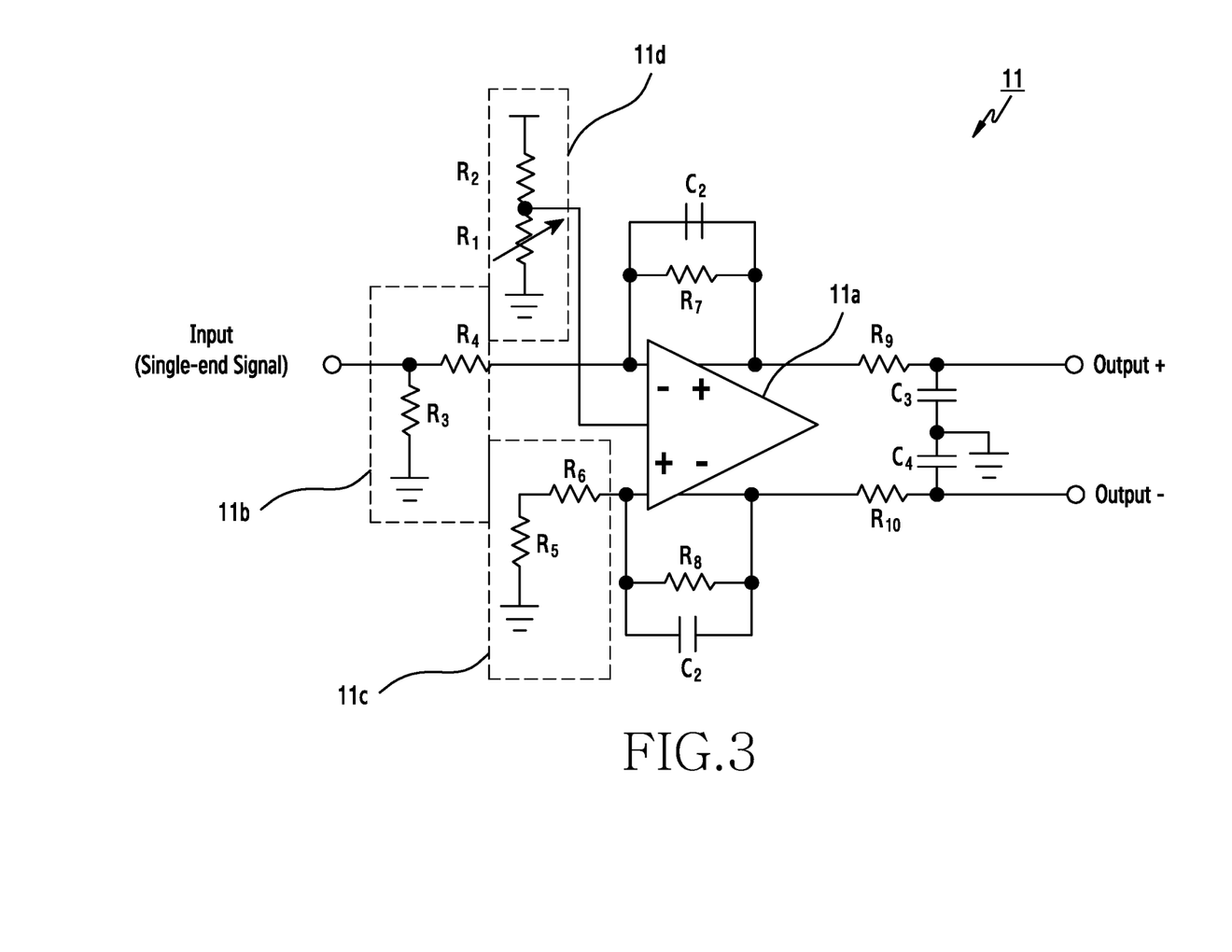
FIG. 3 illustrates an example of a structure of a differential signal converter 11 of a resonance-type wireless power Tx 100 according to various embodiments of the present disclosure.

FIG. 3 illustrates an example of a structure of the differential signal converter 11 of the resonance-type wireless power Tx 100 according to various embodiments of the present disclosure. Referring to FIG. 3, as one example of the present disclosure, the differential signal converter 11 may be designed in an analog manner in which a fully differential OP-AMP 11a is used.

Further, a control circuit for controlling a phase difference and amplitude between the differential signals may be additionally designed. Herein, the control circuit may be variously referred to as an Output Common Mode Voltage (OCMV) control circuit or the like, and is hereinafter simply referred to as the OCMV control circuit.

The OCMV control circuit (not shown) may include a circuit configuration 11b (e.g., R3, R4) for inputting a single-end signal generated from the signal generator 10 to one input node (−) of the OP-AMP 11a, a circuit configuration 11c (e.g., R5, R6) to be added to the other input node (+) of the OP-AMP 11a as a dummy load to balance an input impedance of the OP-AMP 11a, and a circuit configuration 11d (e.g., R1, R2) for controlling a pulse width between differential signals output through the OP-AMP 11a, by controlling the resistance of a variable resistor R1.

The circuit configuration 11a may include a resistor R3 between the input and ground. Additionally, a resistor R4 may be connected between the junction where resistor R3 is connected to the input and the (−) input node of the OP-AMP. The circuit configuration 11b may includes resistors R5 and R6 connected in series between the (+) input node of the OP-AMP and ground. The (−) input node and the (+) output as well as the (+) input node and the (−) output include a feedback loop comprising a resistor (R7, R8) in parallel with a capacitor (C2).

The controller 17 can digitally control the pulse width between the differential signals by adjusting an OCMV value, e.g., a digital code value, applied to the circuit configuration 11d, thereby controlling the resistance of the variable resistor R1. That is, the controller 17 can use the OCMV to control the resistance of the variable resistor R1. Changing the resistance of R1 changes the resistance ratio of circuit configuration 11d, as well as the voltage applied across resistors R1 and R2. By controlling the resistance of R1, the duty cycle of the pulse can be controlled.

Returning to FIG. 2, the resistor R1 used in the resistance division is a variable resistor which is varied by the controller 17. The differential signals output by the differential signal converter 11 are input to the power amplifier 13 via the gate driver 12.

The amplified differential signals output by the power amplifier 13 are subjected to impedance matching so as to operate with high efficiency and in a wide impedance region at an operating frequency band by the impedance matching circuit 14, and thereafter are input to the Tx resonator 15.

The Tx resonator 15 generates a magnetic field which vibrates due to the amplified differential signals to wirelessly transmit power. The gauge 16 measures amplitudes of the amplified differential signals by receiving the differential signals input to the Tx resonator 15 in a high impedance region, and delivers the measurement information to the controller 17. In certain embodiments, the gauge 16 can measure the difference amplitude between the amplified differential signals and provide the measured difference to the controller 17.

The controller 17 may variably control the OCMV to the differential signal converter 11 on the basis of the measurement information, and also may variably control DC power of the variable DC power supply 18. For example, the controller 17 may precisely control the differential signal converter 11 by using a digital code value so that the phase difference and amplitude between the amplified differential signals measured by the gauge 16 are to be a pre-set reference value, i.e., a phase difference of 180° or within a threshold of the pre-set reference value, or to be the same amplitude.

Further, the controller 17 may precisely control the variable DC power supply 18 by using a digital code value so that the amplitude of the differential signals is to be a pre-set reference Peak to Peak (P2P) value or to satisfy an allowable error margin.

Figure 4:
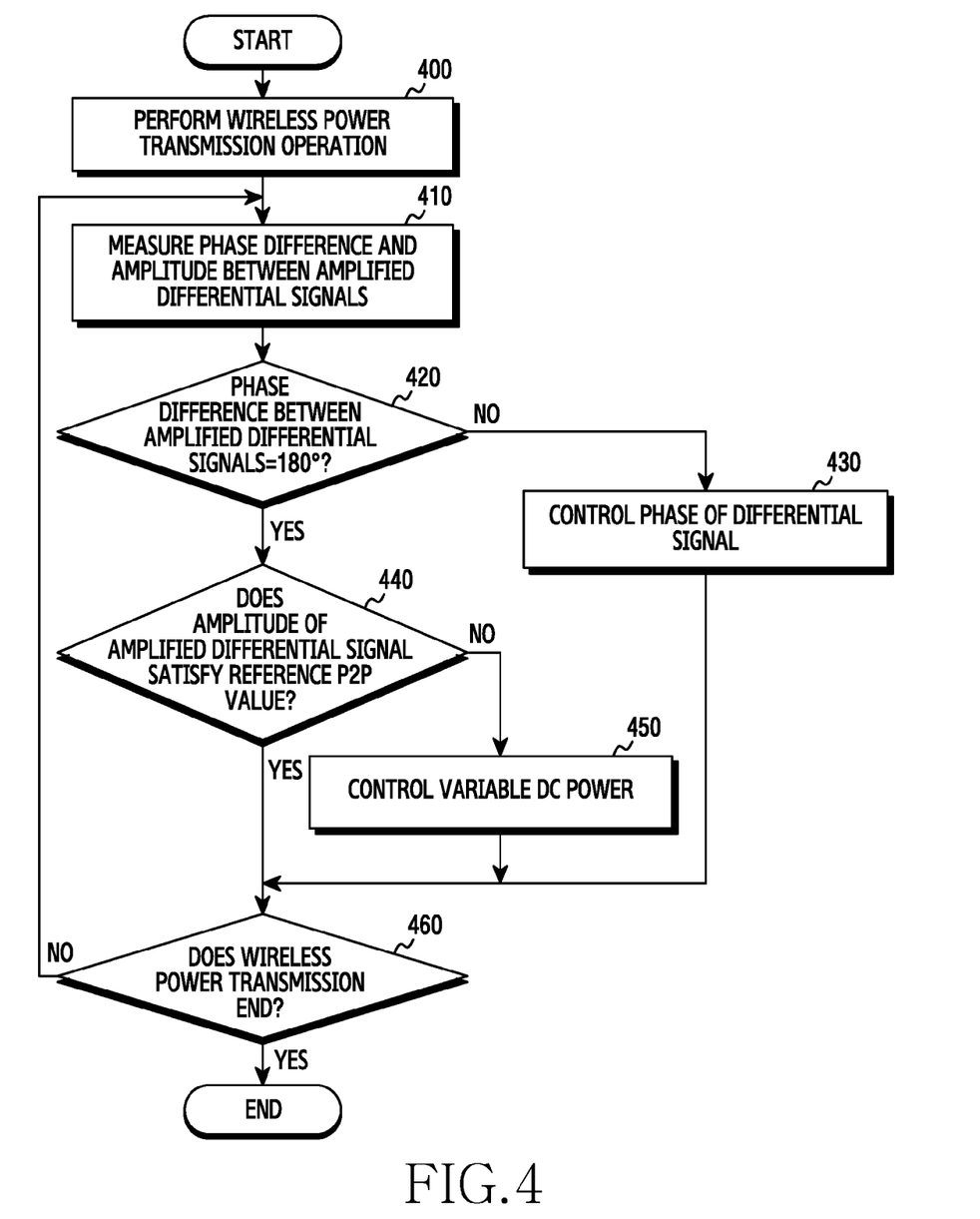
FIG. 4 is a flowchart illustrating a method of controlling a differential signal of a resonance-type wireless power Tx 100 according to various embodiments of the present disclosure.
Figure 5:
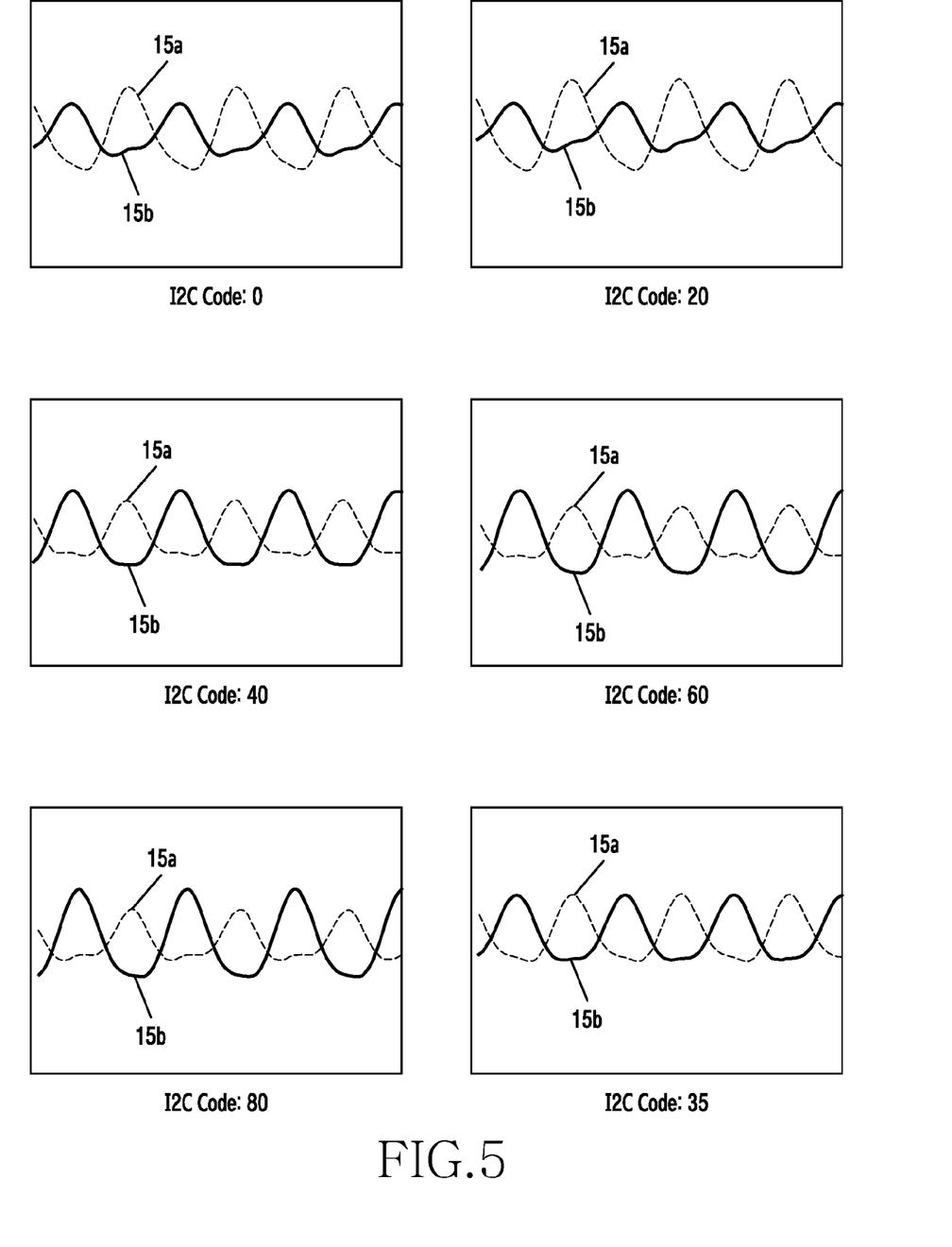
FIG. 5 illustrates an example of amplified differential signals measured by a gauge 16 of a resonance-type wireless power Tx 100 according to various embodiments of the present disclosure.
Figure 6:
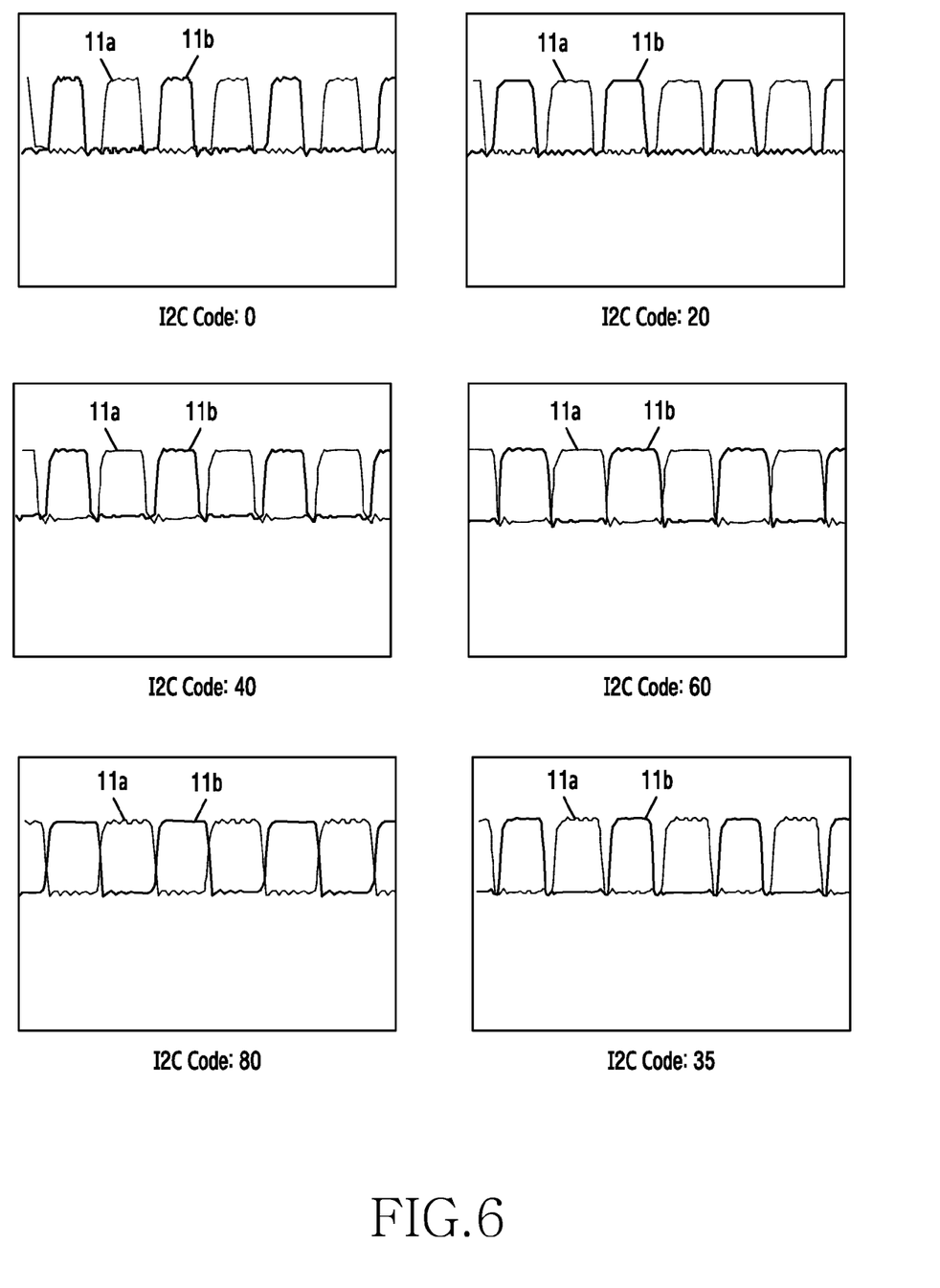
FIG. 6 illustrates an example of differential signals output from a differential signal converter 11 of a resonance-type wireless power Tx 100 according to various embodiments of the present disclosure.

FIG. 4 is a flowchart illustrating a method of controlling a differential signal of the resonance-type wireless power Tx 100 according to various embodiments of the present disclosure. FIG. 5 illustrates an example of amplified differential signals measured by the gauge 16 of the resonance-type wireless power Tx 100 according to various embodiments of the present disclosure. FIG. 6 illustrates an example of differential signals output from the differential signal converter 11 of the resonance-type wireless power Tx 100 according to various embodiments of the present disclosure.

Referring to FIG. 4, in operation 400, the controller 17 of the resonance-type wireless power Tx 100 may perform a typical wireless power transmission operation for wirelessly transmitting power through a magnetic field which vibrates at a specific frequency after converting DC power into AC power when the resonance-type wireless power Rx 200 of various types, for example, a smart phone or the like, approaches within a pre-set specific distance or is cradled.

In operation 410, the gauge 16 of the resonance-type wireless power Tx 100 may measure a phase difference and amplitude between amplified differential signals input to the Tx resonator 15, and may deliver the measurement result information to the controller 17.

For example, as shown in FIG. 5, the differential signals measured by the gauge 16 are first and second amplified differential signals 15a and 15b which are output from the impedance matching 14 and are input to the Tx resonator 15 to drive the Tx resonator 15.

The first and second amplified differential signals 15a and 15b may be, for example, sine wave signals having a specific frequency. The first and second amplified differential signals 15a and 15b may have the highest efficiency of wireless power transmission when having a phase difference of 180° and the same amplitude.

In operation 420, the controller 17 may decide whether a phase difference between the measured first and second amplified differential signals 15a and 15b has a pre-set reference value, for example, a phase difference of 180°. The phase difference of 180° which is a reference of the decision is an ideal value, and may have any allowable error margin, such as 1%, 2%, or 3%.

In operation 430, if the phase difference between the first and second amplified differential signals 15a and 15b is not the phase difference of 180°, the controller 17 may variably control the differential signal converter 11 and thus may perform a phase control operation of a differential signal so that the phase difference between the first and second amplified differential signals 15a and 15b eventually becomes the phase difference of 180°.

Herein, the controller 17 may change a signal amplitude for controlling the differential signal converter 11 so that the first and second amplified differential signals 15a and 15b have the same amplitude. For example, as shown in FIG. 6, the first and second differential signals 11a and 11b output from the differential signal converter 11 may be square wave signals having a specific frequency.

The phase control and amplitude control operation of the differential signal may be implemented by a digital control operation for changing a I2C code value to be applied to the differential signal converter 11 by the controller 17.

For example, as shown in FIG. 6, when the controller 17 performs a digital control operation for changing the I2C code value to be applied to the differential signal converter 11 into I2C code: 0, 20, 40, 60, 80, and 35, a pulse width of first and second differential signals 11a and 11b output from the differential signal converter 11 may vary variously.

Herein, it is shown in FIG. 6 that the first and second differential signals 11a and 11b output from the differential signal converter 11 has a widest pulse width while not overlapping with each other when the I2C code value is I2C code: 35.

Further, it is shown in FIG. 5 that the phase difference between the first and second amplified differential signals 15a and 15b input to the Tx resonator 15 have the same amplitude while having a phase difference of 180° when the I2C code value is I2C code: 35.

If the phase difference between the first and second amplified differential signals 15a and 15b is the phase difference of 180°, the first and second differential signals 15a and 15b naturally have the same amplitude. Herein, since the gate driver 12, the power amplifier 13, the impedance matching 14, or the like exists between the differential signal converter 11 and the Tx resonator 15, the gauge 16 does not measure the first and second differential signals 11a and 11b output from the differential signal converter 11 but measures the phase difference and amplitude between the first and second amplified differential signals 15a and 15b input to the Tx resonator 15.

In operation 440, the controller 17 may decide whether a P2P value of the first and second amplified differential signals 15a and 15b measured by the gauge 16 satisfies a pre-set reference P2P value.

In operation 450, if the reference P2P value is not satisfied, the controller 17 controls the operation of the variable DC power supply 18 to change a DC power value applied to the power amplifier 13. As a result, a P2P value of the first and second amplified differential signals 15a and 15b input to the Tx resonator 15 satisfies the pre-set reference P2P value.

In operation 460, the controller 17 may decide whether a wireless power transmission operation ends when the Rx resonator of the resonant-type wireless power Rx 200 is separated by more than a pre-set specific distance or when battery charging is complete.

Accordingly, transmission efficiency deterioration which occurs due to a deviation or the like of electronic components included in the resonance-type wireless power Tx 100 can be improved, and transmission efficiency deterioration which occurs due to a phase difference or the like between the Tx resonator 15 and its associated Rx resonator (not shown) and a harmonic radiation feature can be improved.

The above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

In addition, it would be recognized that when a general purpose computer accesses code for implementing the processing shown herein, the execution of the code transforms the general purpose computer into a special purpose computer for executing the processing shown herein. Any of the functions and steps provided in the Figures may be implemented in hardware, or a combination hardware configured with machine executable code and may be performed in whole or in part within the programmed instructions of a computer. No claim element herein is to be construed under the provisions of 35 U.S.C. 112, sixth paragraph, unless the element is expressly recited using the phrase "means for".

As used hereinafter, "differential signals" may refer to the output of any of differential signal converter 11, gate driver 12, power amplifier 13, and impedance matching circuit 14. As used hereinafter, "amplified differential signals" may refer to the output of any of the power amplifier 13 and the impedance matching circuit 14. "operably coupled" shall not be limited to a direct connection, and may include intervening components.

While particular embodiments have been shown and described in the detailed description of various embodiments of the present disclosure, it will be apparent to those skilled in the art that various modifications and changes may be made therein without departing from the spirit and scope of various embodiments of the present disclosure. Therefore, the scope of the present disclosure is not limited to the embodiments described herein, but is defined by the appended claims and equivalents thereof.

What is claimed is:

1. An apparatus for controlling a differential signal of a wireless power transmitter, comprising:
    a converter configured to convert a single signal into differential signals;
    an amplifier operably coupled to the converter and configured amplify power of the differential signals, thereby providing amplified differential signals;
    a gauge operably coupled to the amplifier and configured to measure a phase difference and amplitude between the amplified differential signals; and
    a controller for converting a pulse width of the differential signals by controlling the converter according to measurements by the gauge.

2. The apparatus of claim 1, wherein the controller changes the pulse width of the differential signals such that the phase difference and a difference in amplitude between the amplified differential signals are to be pre-set reference values.

3. The apparatus of claim 2, wherein the pre-set reference values for the phase difference and amplitude between the amplified differential signals are to be a phase difference of within a threshold of 180° and the difference in amplitude is within another threshold of zero.

4. The apparatus of claim 1, wherein the controller controls the converter by using a multi-level digital code value to change the pulse width of the differential signals.

5. The apparatus of claim 4, wherein the controller controls the converter by using the multi-level digital code value so that the pulse width of the differential signals has a widest pulse width while avoiding overlapping.

6. The apparatus of claim 1, further comprising a power supply for variably supplying Direct Current (DC) based power to the amplifier, wherein the controller varies the DC based power to be supplied to the amplifier by controlling the power supply such that an amplitude of the amplified differential signal has a pre-set reference Peak To Peak (P2P) value.

7. The apparatus of claim 1, wherein the wireless power transmitter is a resonance-type wireless power transmitter, and wherein the amplifier is a power amplifier of a switching mode.

8. The apparatus of claim 1, wherein the converter comprises a fully differential Operational Amplifier (OP-AMP) and an output common mode voltage control circuit.

9. The apparatus of claim 8, wherein a circuit configuration for inputting the single signal is installed in one input node of the fully differential OP-AMP, and a circuit configuration of a dummy load for impedance matching is installed in another input node of the fully differential OP-AMP.

10. The apparatus of claim 1, further comprising:
a signal generator for generating the single signal;
a gate driver for pre-amplifying the differential signals;
an impedance matching circuit for matching an impedance of the amplified differential signals; and
a transmission resonator for generating a magnetic field which vibrates according to the impedance-matched amplified differential signals.

11. A method of controlling a differential signal of a wireless power transmitter, the method comprising:
converting a single signal into differential signals;
amplifying power of the differential signals, thereby resulting in amplified differential signals;
measuring a phase difference and amplitude between the amplified differential signals; and
controlling a pulse width of the differential signals according to the measuring.

12. The method of claim 11, wherein during the controlling, the pulse width of the differential signals is changed such that the phase difference and a difference in amplitude between the amplified differential signals are to be pre-set reference values.

13. The method of claim 12, wherein the pre-set reference values is a pre-set reference values for the phase difference and amplitude between the amplified differential signals are to be a phase difference within a threshold of 180° and the difference in amplitude is within another threshold of zero.

14. The method of claim 11, wherein in during the controlling, the pulse width of the differential signals to be changed is changed by using a multi-level digital code value.

15. The method of claim 14, wherein during the controlling, a pulse width of the differential signals to be changed is changed to have a widest pulse width while avoiding overlapping.

16. The method of claim 11, further comprising:
supplying Direct Current (DC) based power for amplifying; and
varying the supplied the DC based power such that an amplitude of the amplified differential signal has a pre-set reference Peak To Peak (P2P) value.

17. The method of claim 11, wherein the converting is performed by a fully differential Operational Amplifier (OP-AMP) and an output common mode voltage control circuit.

18. The method of claim 17, wherein a circuit configuration for inputting the single signal is installed in one input node of the fully differential OP-AMP, and a circuit configuration of a dummy load for impedance matching is installed in another input node of the fully differential OP-AMP.

19. The method of claim 11, further comprising:
generating the single signal;
pre-amplifying the differential signals;
matching an impedance of the amplified differential signals; and
generating a magnetic field which vibrates according to the impedance-matched amplified differential signals.

20. A computer readable recording medium for storing a program for performing a method comprising:
converting a single signal into differential signals;
amplifying power of the differential signals, thereby resulting in amplified differential signals;
measuring a phase difference and amplitude between the amplified differential signals; and
converting a pulse width of the differential signals according to the measuring.

* * * * *